US012235491B2

(12) United States Patent
Yen et al.

(10) Patent No.: US 12,235,491 B2
(45) Date of Patent: Feb. 25, 2025

(54) HIGH VOLTAGE MONITORING FOR OPTICAL SWITCHING APPLICATIONS

(71) Applicant: Google LLC, Mountain View, CA (US)

(72) Inventors: Dennis Yen, Los Altos, CA (US); Scott McCauley, Sunnyville, CA (US); Kevin Yasumura, Lafayette, CA (US)

(73) Assignee: Google LLC, Mountain View, CA (US)

( * ) Notice: Subject to any disclaimer, the term of this patent is extended or adjusted under 35 U.S.C. 154(b) by 221 days.

(21) Appl. No.: 17/573,952

(22) Filed: Jan. 12, 2022

(65) Prior Publication Data

US 2022/0413225 A1 Dec. 29, 2022

Related U.S. Application Data

(60) Provisional application No. 63/215,678, filed on Jun. 28, 2021.

(51) Int. Cl.
*G02B 6/35* (2006.01)
*G01R 31/52* (2020.01)
*G01R 31/28* (2006.01)

(52) U.S. Cl.
CPC ........... *G02B 6/3518* (2013.01); *G01R 31/52* (2020.01); *G01R 31/2829* (2013.01)

(58) Field of Classification Search
CPC .. G01R 31/52; G01R 31/2829; G02B 6/3586; G02B 6/3518
USPC .......................................................... 361/23
See application file for complete search history.

(56) References Cited

U.S. PATENT DOCUMENTS

| | | | | |
|---|---|---|---|---|
| 5,063,516 A * | 11/1991 | Jamoua | ................ | G01R 31/007 702/58 |
| 6,514,781 B2 * | 2/2003 | Chang | ................ | G02B 26/0841 257/420 |
| 7,277,606 B1 * | 10/2007 | Sakai | ..................... | G02B 6/359 398/19 |
| 8,255,183 B1 * | 8/2012 | Husted | .................. | H04B 17/14 702/117 |
| 9,366,823 B1 * | 6/2016 | McCauley | ......... | G01C 19/5712 |
| 9,568,517 B2 * | 2/2017 | Lim | ........................ | G06F 17/00 |
| 10,838,000 B2 * | 11/2020 | Lindell | ............... | H03M 1/1071 |

(Continued)

FOREIGN PATENT DOCUMENTS

CN 207096388 U 3/2018

OTHER PUBLICATIONS

Barberio. Fault-tolerant drive electronics for a Xinetics deformable mirror at GeMS DM0. Jul. 27, 2016. Proceedings of SPIE, vol. 9909, pp. 990985-1 through 990985-6.

(Continued)

*Primary Examiner* — Gabriel Agared
(74) *Attorney, Agent, or Firm* — Lerner David LLP

(57) ABSTRACT

A diagnostic voltage or current path can be used for each MEMS actuator control channel to detect and diagnose faults in the actuator control signal path. Multiple measurement points provide additional capabilities of isolating faults among multiple subassemblies or components in the control signal path. The diagnostic voltage or current path uses ADC(s) and multiplexers to monitor multiple control channels and/or multiple measurement points in each control channel. Digitized voltages, or currents in the case of magnetic actuators, read from the diagnostic ADC are compared to expected values to detect and isolate faults.

20 Claims, 11 Drawing Sheets

(56) References Cited

U.S. PATENT DOCUMENTS

2003/0222672 A1   12/2003  Winer
2006/0133721 A1    6/2006  Kopelovitz et al.
2009/0265142 A1*  10/2009  Liu .................... H04L 41/344
                                                    702/190
2012/0212360 A1*   8/2012  Kanter ............... H03M 1/1245
                                                    341/137
2017/0093344 A1*   3/2017  Mahon ............... H03F 3/45475

OTHER PUBLICATIONS

Extended European Search Report for European Patent Application No. 22161750.9 dated Sep. 13, 2022. 10 pages.

* cited by examiner

650

660

670

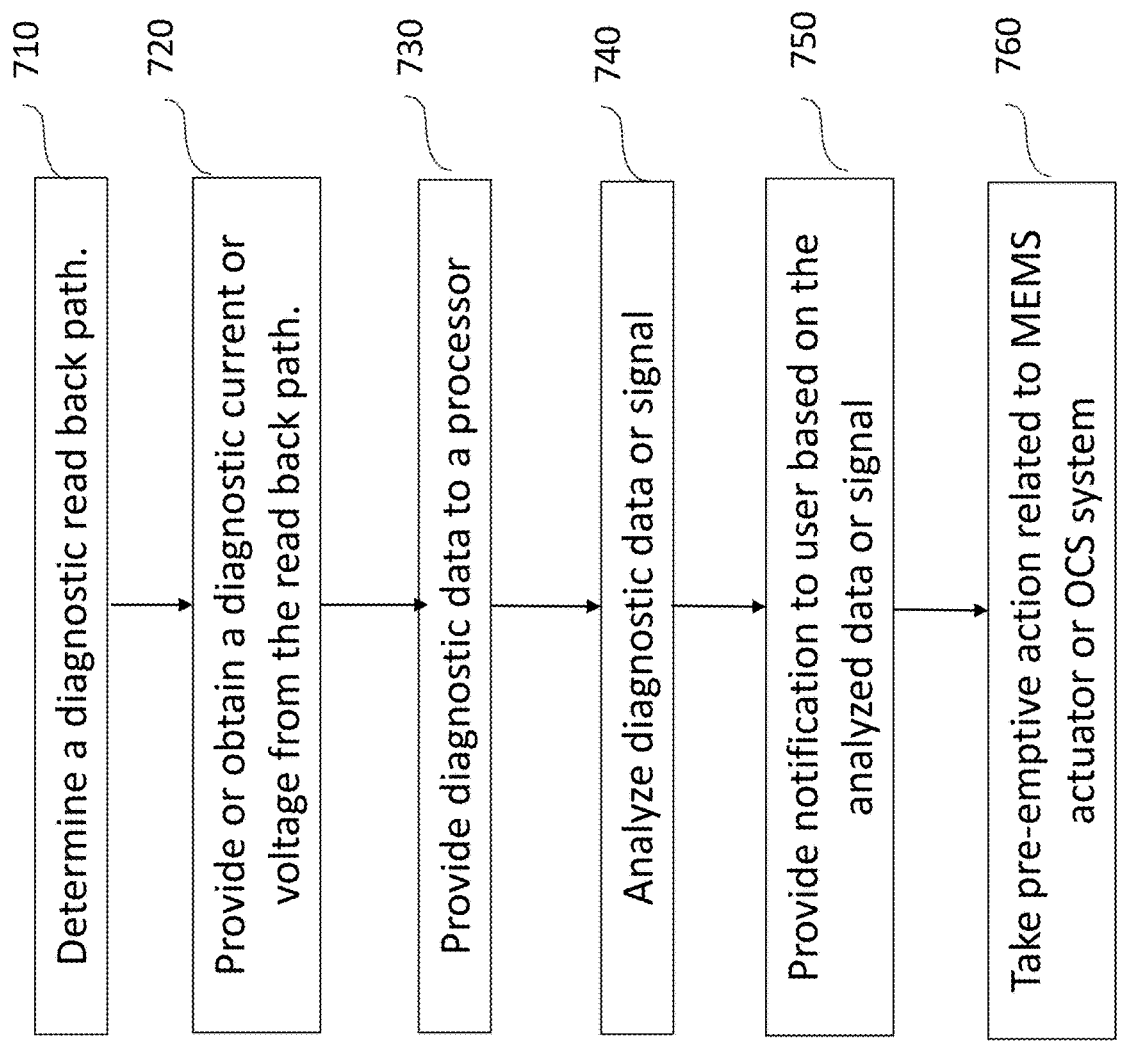

HIGH VOLTAGE MONITORING FOR OPTICAL SWITCHING APPLICATIONS

CROSS-REFERENCE TO RELATED APPLICATIONS

The present application claims the benefit of the filing date of U.S. Provisional Patent Application No. 63/215,678 filed Jun. 28, 2021, the disclosure of which is hereby incorporated herein by reference.

BACKGROUND

Optical communications use modulated light beams to convey information through optical fibers, free space, or waveguides.

An optical circuit switch (OCS) can be used to manage interconnections in optical communication systems. An OCS allows for the transmission of data through the use of light and optical fiber. Functionally, an optical circuit switch may be considered an all-optical, 2D switching matrix that may direct light from any input fiber N to any output fiber M by changing the angles of the mirrors in one or more micro-electromechanical system (MEMS) mirror arrays. The OCS is typically implemented through a mechanical switching mechanism (electro-optical, thermo-optical mechanisms also exist), directing light beams between different ports in free space.

A MEMS-based OCS has a large number of MEMS micro-mirrors. Each micro-mirror is driven by a number of high voltage channels or other types of driver or actuator. In some examples, the number of high voltage channels can be 4, but in some designs, such as in a dual-axis mirror, the number of channels can be 3. In some examples, the number of channels can be any finite number. The failure of a high voltage channel or chip controlling a MEMs mirror can render the MEMS mirror uncontrollable. Further, it is difficult to detect specific defects within a MEMS based system without a detailed and extensive hardware teardown of the equipment, leading to downtime and stopping operation of the MEMS-based OCS.

SUMMARY

Aspects of the disclosed technology enable monitoring of high voltage channels, controls, actuators, mechanisms, or chips controlling mirrors with an OCS system. For example, outputs of individual activators, in a system including a large number of devices each moved by one or more corresponding activators, may be measured. Such measurements may be used to diagnose particular faults within the individual activator, such that the activator can be quickly repaired or replaced. Examples of monitored actuators, mechanism, or chips can include without limitation MEMS actuators, MEMS controlled mirror arrays, piezo-electric controllers or actuators, electro-optical actuators/controllers or switching mechanisms, thermo-optical actuators/controllers or switching mechanisms, current-signal based controllers or actuators, magnetic based controllers or actuators, and voltage-signal based actuators. In addition, control channels or control pathways for the aforementioned controllers or actuators can also be monitored for defects, faults, shorts, or other electrical problems or malfunctions.

Aspects of the disclosed technology include monitoring individual drivers within an OCS system to identify which individual driver is producing a particular error or to identify a particular fault related to the driver. Aspects of the disclosed technology include identification of which driver controlling a mirror within an OCS system is producing an output within a predetermined range of values, wherein the value of the output may be used to identify a particular fault for the driver.

Aspects of the disclosed technology include systems, methods, and devices to allow for active monitoring of drivers or actuators. For example, actuators or drivers may be monitored during operation of an OCS system. The technology can allow for monitoring of actuators for signatures of faults and for pre-emptive repair, replacement, or deprioritization of certain drivers or actuators. For example, a voltage change may be detected in a diagnostic circuit or monitoring component, such as an analog to digital converter (ADC) configured for detection. For example, historic voltage or current data related to a particular driver or actuator can be stored, and when the data differs by a predetermined amount, it can be determined that the driver or actuator has begun to fail. As another example, errors related to mirror pointing accuracy can be analyzed in conjunction with monitored information related to drivers or actuators. As another example, data obtained from multiple ADCs or other detectors can be analyzed in combination to determine types of faults, isolate particular faulty actuators, drivers, or circuits, and identify a cause or location for a fault. In some examples, the disclosed technology can allow for notifications to be provided to user related to the fault, such as for example, the particular driver or actuator which is faulty, the type of defect or fault, and the effect on a particular mirror for the fault.

Aspects of the disclosed technology include systems, methods, and devices to allow for software-implemented detection and correction algorithms, based on localized error detection. In some examples, the disclosed technology can allow a user to use or design self-tests for an OCS system, and based on the tests, to isolate hardware faults based on failure messages or other data.

Aspects of the disclosed technology can include methods, systems, and devices which can include an optical circuit switch (OCS), the OCS comprise an OCS control system; a driver or actuator actuated mirror array, wherein individual mirrors within the mirror array are coupled with at least one actuator controlled by the OCS control system; a diagnostic circuit coupled to the at least one actuator via a drive circuit, the diagnostic circuit comprising a first analog to digital converter (ADC), wherein the first analog to digital convertor is coupled to a processor or OCS control system and configured to output electrical information related to the drive circuit.

The system can comprise a second ADC, the second analog to digital converter electrically downstream from the first ADC. The second ADC can be configured to detect a fault within a printed circuit board, connector, or cable, connecting a power supply to the actuator. The first ADC and the second ADC can be configured to collectively monitor a current leak within an interconnect between a power supply and the actuator. The electrical information is one of capacitance, impedance, resistance, voltage, current, phase or frequency. The diagnostic circuit can be configured to detect a short within the actuator.

The diagnostic circuit can be configured to detect an open circuit. The open circuit can exist upstream to the first ADC. The diagnostic circuit can be configured to detect a damaged field-effect transistor or power supply rail upstream to the first ADC. The DAC can be connected to the OCS control system and provides a drive current or drive voltage for the actuator. The DAC is configured to provide a test voltage or test current for the diagnostic circuit. Additional ADCs can be configured to detect or diagnose additional points or pathways along the diagnostic circuit.

Aspects of the disclosed technology can include a method for detecting a fault within an actuator drive circuit integrated within an optical circuit switch. The method can comprise determining, using a processor, a diagnostic read path within a circuit; providing or obtaining, responsive to a command by an OCS control module, a diagnostic current or voltage from the read path; obtaining diagnostic data from an ADC; analyzing, by the processor, the diagnostic data to determine a fault. The method can comprise analyzing a plurality of data obtained from a plurality of ADCs, each of the plurality of ADCs corresponding to a unique actuator. The method can comprise comparing the diagnostic data to a historic value. The method can comprise determining if a fault exists when the diagnostic data does not match the historic value. The method can comprise matching the diagnostic data to data associated with a known fault type. The known fault type can be one of an open circuit, a short circuit, or voltage leak.

Aspects of the disclosed technology can allow for a "fail-safe" related to detecting faults or other issues with an actuator driver circuit. In broad overview, if the diagnostic circuit detects voltage, additional software features, such as those described herein, can be implemented to drive the DAC voltage to a level which can allow the system to be set into a "low power" environment to avoid additional damage to the systems described herein.

A notification can be provided to a user upon classifying the type of fault. The method can comprise deactivating or preventing use of an actuator upon determining a fault exists within an actuator drive circuit or an actuator control channel. The actuator can be one of piezo actuators, magnetic actuators, or microelectromechanical systems (MEMS) actuators.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing.

FIG. 7 is a flow diagram illustrating an example method related to analyzing or detecting faults with a MEMS drive circuit according to aspect of the disclosure.

DETAILED DESCRIPTION

Figure 1:
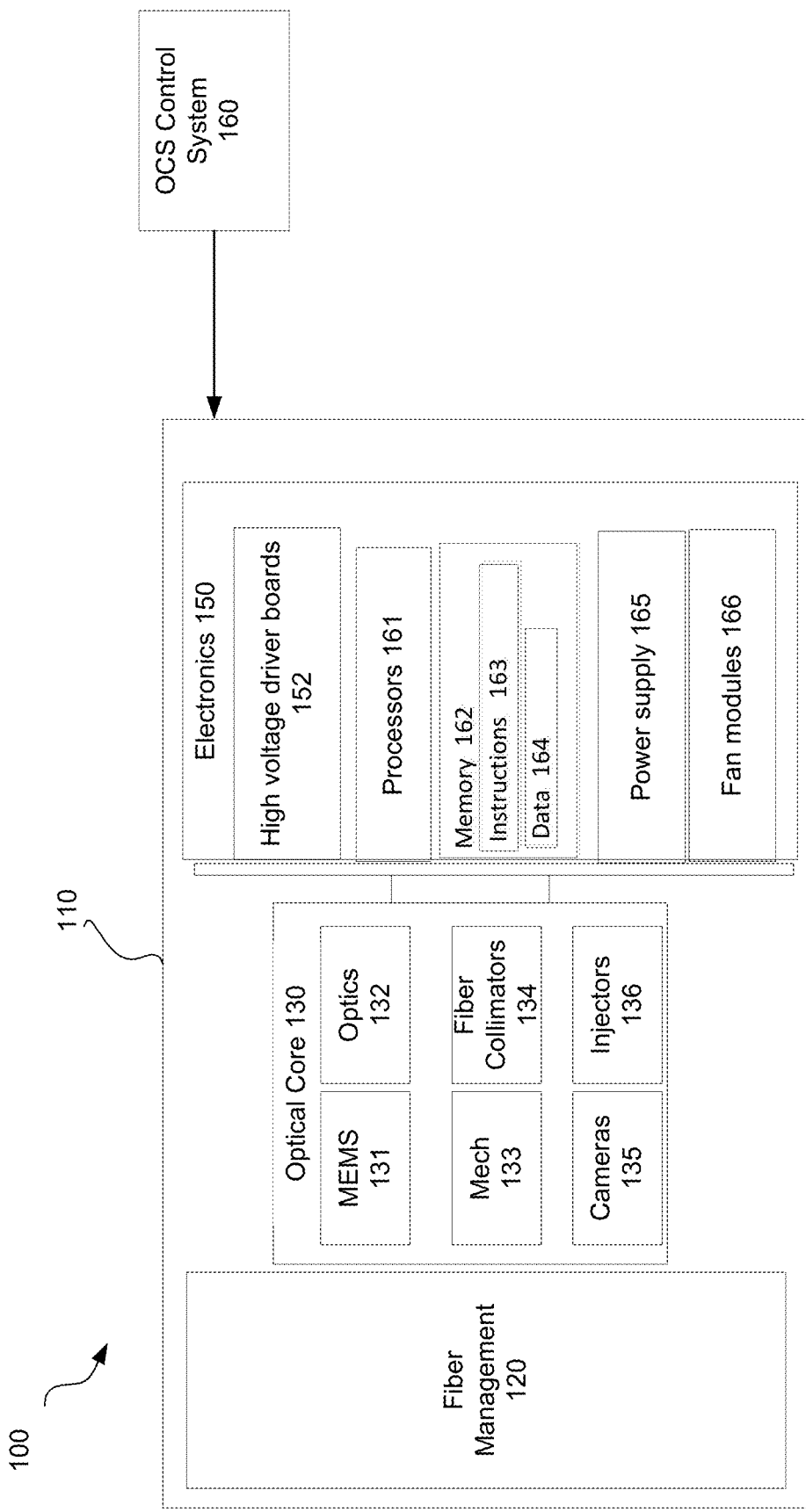
FIG. 1 is a block diagram of an example optical circuit switch according to aspects of the disclosure.

The present disclosure relates to monitoring actuators and drivers and diagnosing errors and/or failures detected in such actuators and drivers. As non-limiting examples, drivers or actuators can consist of electrostatic actuators which are capacitive in nature, such as zero current, and can rely on electrostatic fields generated by relatively high voltages, such as up to a few hundred volts, between different etched features in the MEMS to generate mechanical force and mirror movement. In other examples, actuators may use electrostatic, magnetic (current signals) and/or Piezo (voltage signals) actuators. Although the following disclosure outlines voltage controlled actuators and monitoring methods, the techniques can easily be extended to magnetic actuators based on measuring currents rather than voltages.

In some examples, the disclosed technology can be used to monitor, detect, or diagnose the large number of potential failures which can exist within an OCS switch as they relate to actuators, electronics, or electrical interconnects. Non-limiting examples of such failures include, for example, drive field-effect transistor (FET) stage voltage breakdown due to semiconductor manufacturing defects; drive FET stage failure or excessive leakage resulting from accelerated ageing at high temperature operation; open circuit failures between the Drive FET stage(s) and MEMS mirrors due to manufacturing soldering defects, connector defects, and cable and/or printed circuit board (PCB) trace defects; excessive leakage currents in the interconnect due to, for example manufacturing or environmental contamination and resulting degradation under applied electrical fields over time; and latent defects or short circuits in the MEMS actuators and associated packaging.

In some examples, a diagnostic voltage or current readback path for each MEMS actuator voltage control channel can provide a method to detect and diagnose faults in the actuator control signal path. Multiple measurement points can be used to provide additional capabilities of isolating faults among multiple subassemblies or components in the control signal path. The diagnostic voltage or current readback path can use analog-to-digital convertors (ADCs) and multiplexers to view multiple control channels and/or multiple measurement points in each control channel. Digitized voltages, or currents, in the case of magnetic actuators, can be read from the diagnostic ADC and can be compared to expected values to detect and isolate faults.

As used in this disclosure, a MEMS driver or MEMS actuator can be used interchangeably to refer to any mechanism which can be used to cause motion of a MEMS mirror, including but not limited to, mechanical, electrical, magnetic, or capacitive mechanisms. As used in this disclosure, a MEMS actuator drive circuit can be interchangeable with a MEMS actuator voltage control channel or a MEMS actuator control channel. While the examples below are described primarily in connection with MEMS mirrors and actuators, the technology may be applied to any of a variety of types of control mechanisms, such as piezo actuators, magnetic actuators, etc.

FIG. 1 illustrates an example OCS 100, such as an OCS that may be used in datacenter. The OCS 100 includes a structure such as chassis 110 supporting a number of components. In a front of the OCS chassis 110 are optical fiber connections, such as fiber management block 120. The OCS 100 may further include an optical core 130. The optical core can also be referred to as the OCS internal optical path or OCS internal optical space. The optical core houses MEMS 131, fiber collimators 134, optics 132, cameras 135, and injectors 136 and other mechanisms 133. A rear of the OCS 100 includes electronics 150, such as high voltage driver boards 152 for the MEMS, one or more processors 161, such as a CPU board, one or more memories 162 storing executable software, and power supplies 165 and fan modules 166. The chassis 110 interfaces with OCS control system 160. While a number of components are shown, it should be understood that such components are merely non-limiting examples, and that other components may additionally or alternatively be included.

There may be any number of input fibers and output fibers connected to the front of the OCS chassis 110. Inside the chassis 110, these fiber fanouts are spliced to the fiber collimators 134.

The fiber collimators 134 are lensed fiber arrays. Just as one example, the fiber collimators 134 may include tens or hundreds or more fiber arrays. The fibers are assembled in a hole array that matches a MEMS array grid pattern, thereby forming a fiber array. The fiber array is attached to a mounting flange. A lens array is aligned and attached to the fiber array. Fiber and lens position errors are very tightly controlled.

The one or more processors 161 may be any conventional processors, such as commercially available microprocessors. Alternatively, the one or more processors may be a dedicated device such as an application specific integrated circuit (ASIC) or other hardware-based processor. Although FIG. 1 functionally illustrates the processor, memory, and other elements of the OCS control system 160 as being within the same respective blocks, it will be understood by those of ordinary skill in the art that the processor or memory may actually include multiple processors or memories that may or may not be stored within the same physical housing. Similarly, the memory may be a hard drive or other storage media located in a housing different from that of the OCS control system 160. Accordingly, references to a processor or computing device will be understood to include references to a collection of processors or computing devices or memories that may or may not operate in parallel.

Memory 162 may store information that is accessible by the processors 161, including instructions 163 that may be executed by the processors 161, and data 164. The memory 162 may be of a type of memory operative to store information accessible by the processors 161, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions 163 and data 164 are stored on different types of media.

Data 164 may be retrieved, stored or modified by processors 161 in accordance with the instructions 163. For instance, although the present disclosure is not limited by a particular data structure, the data 164 may be stored in computer registers, in a relational database as a table having a plurality of different fields and records, XML documents, or flat files. The data 164 may also be formatted in a computer-readable format such as, but not limited to, binary values, ASCII or Unicode. By further way of example only, the data 164 may be stored as bitmaps comprised of pixels that are stored in compressed or uncompressed, or various image formats (e.g., JPEG), vector-based formats (e.g., SVG) or computer instructions for drawing graphics. Moreover, the data 164 may comprise information sufficient to identify the relevant information, such as numbers, descriptive text, proprietary codes, pointers, references to data stored in other memories (including other network locations) or information that is used by a function to calculate the relevant data.

The instructions 163 may be used to control components of the optical circuit switch described herein. It should be understood that the optical circuit switch may include other components which are not shown but may be utilized in execution of the instructions 163.

Figure 2A:
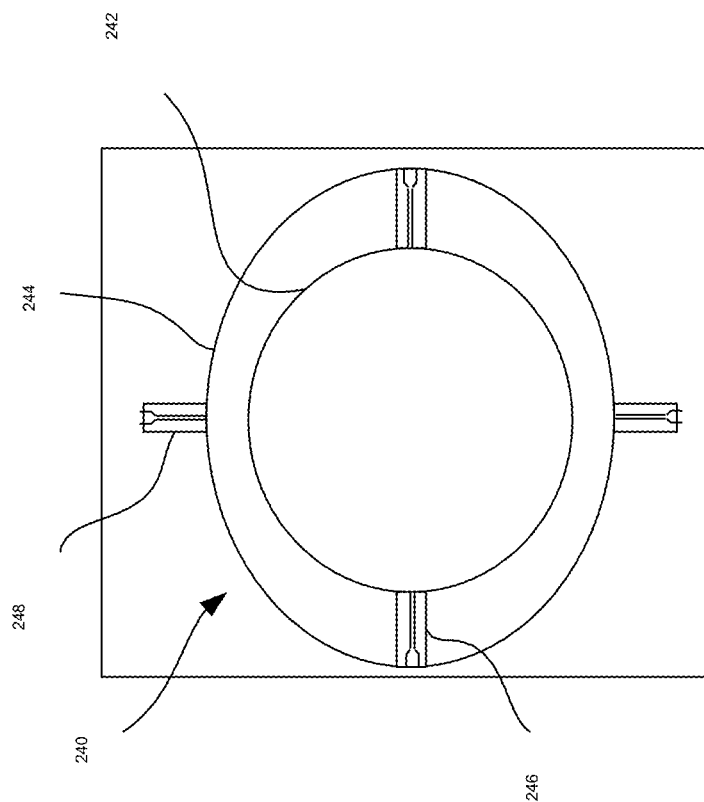
FIG. 2A is a diagram of a two-axis microelectromechanical system (MEMS) mirror assembly for use in an integrated optical assembly, according to aspects of the disclosure.

FIG. 2A illustrates an example MEMS mirror 240. The MEMS mirror 240 may be approximately 1 mm in size and highly reflective. For example, the MEMS mirror 240 may be coated with a highly reflective material, such as gold. The mirror 240 includes an inner portion 242 and an outer portion 244, wherein the inner portion is rotatable about a first axis and the outer portion is rotatable about a second axis. For example, the inner portion may rotate about inner torsion beams 246 actuated by a comb drive actuator. The outer portion may rotate about outer torsion beams 248 actuated by a comb drive actuator. The comb drive actuators may be high voltage, electro-static vertical comb drives which rotate the mirrors about the torsion beams. For example, the rotation may be approximately +/−1-10 degrees when a voltage ranging between 10 s of volts to hundreds of volts is applied across the electrodes. While FIGS. 2A-B illustrate MEMS mirrors, it should be understood that other systems may include other types of optical discs or elements that move about one or more axes.

Figure 2B:
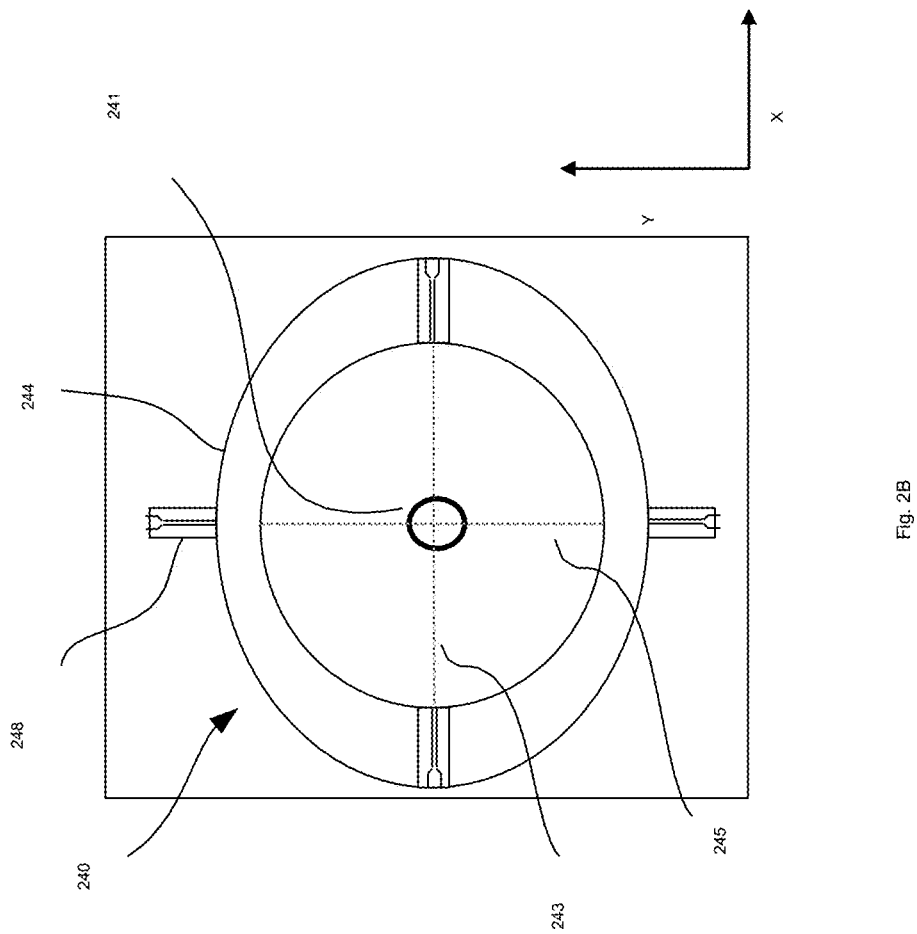
FIG. 2B is a diagram of a two-axis MEMS mirror assembly for use in an integrated optical assembly, according to aspects of the disclosure.

FIG. 2B illustrates additional aspects of MEMS mirror 240. FIG. 2B illustrates the centroid of MEMS mirror 240, centroid 241. Centroid 241 may correspond with the center of mass of MEMS mirror 240. For example, when the density of the MEMS mirror is uniform, the center of mass and the centroid 241 would be at the same location. FIG. 2B also illustrates a first axis 243 of rotation, such as an x-axis. Similarly, FIG. 2B illustrates a second axis 245 of rotation, such as a y-axis. Rotation of the MEMS mirror about either axis 243 or axis 245 may be achieved through rotating torsion beam 246 or torsion beam 248 respectively. By actuation of all torsion beams attached to MEMS mirror control 240, it is possible to move MEMS mirror 240 in a direction perpendicular to the plane formed by the two axes of rotation, axis 243 and axis 245, such as a z-axis. Thus, the MEMS mirror may be moved in at least three independent directions. The movement of the MEMS mirror in these three independent directions may also be referred to as tip, tilt, and piston actuation of the MEMS mirror. The amount of movement of the MEMS mirror may be tracked by the movement of centroid 241 with respect to three independent axes, such as an x-axis, y-axis, and z-axis.

In some examples, it may be necessary to adjust the positioning of one or more MEMS mirrors, such as MEMS mirror 240. As an example, it may be necessary to redirect light reflected from a MEMS mirror away from other optical components. As another example, it may be necessary to remove one of the MEMS mirrors out of the field of view of a particular camera. Removing a MEMS mirror from the camera field of view may be referred to as "parking" of the MEMS mirror. Parking may be achieved by applying voltages to the driver elements capable of moving a MEMS mirror. However, the high voltage required to park a MEMS mirror may damage the driver elements associated with the MEMS mirror through more stress on electronic components and aging, increasing the likelihood of failure in the future.

Figure 3:
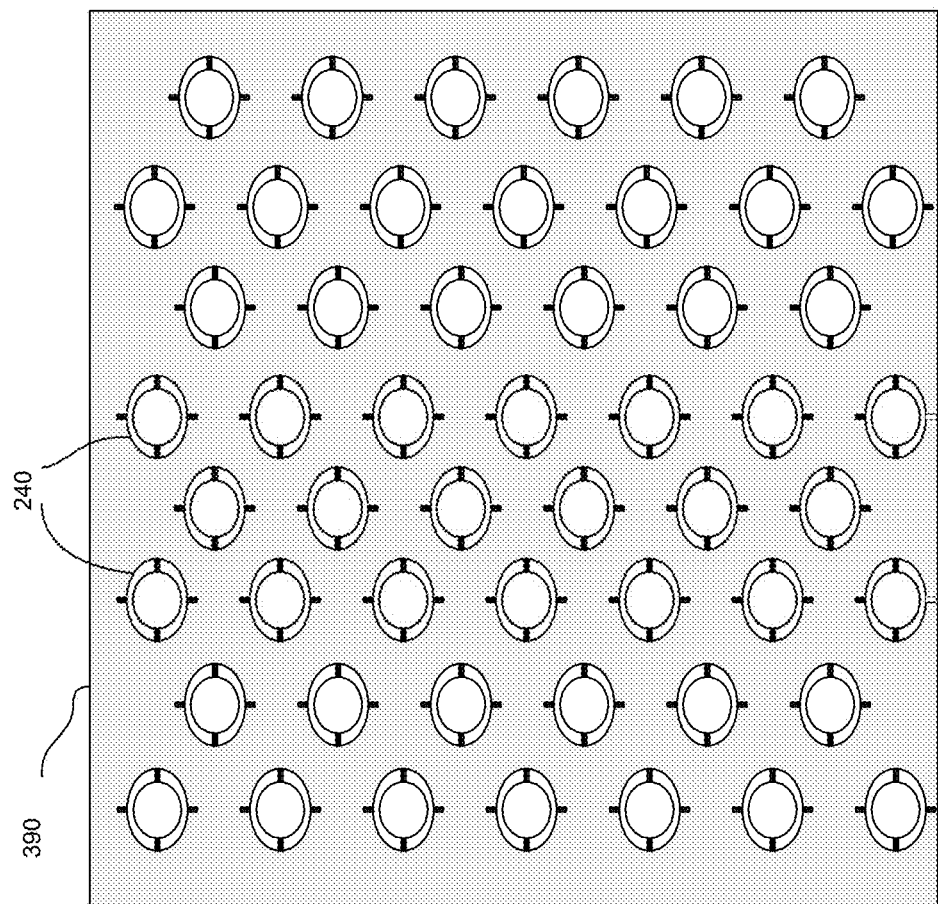
FIG. 3 is a diagram of a two-axis MEMS mirror assembly for use in an integrated optical assembly, according to aspects of the disclosure.

FIG. 3 illustrates an example die 390 including an array of MEMS mirrors 240. According to some examples, the MEMS die packages include MEMS mirror arrays, but in other examples any number of MEMS mirrors may be included. The die may be hermetically sealed inside a package with a window in its lid. Not all of the mirrors may be needed or used at a same time. For example, only the best mirrors and fibers in a MEMS mirror array may be selected to make an optical switch, which may be divided as a number of ports+several spares.

Figure 4:
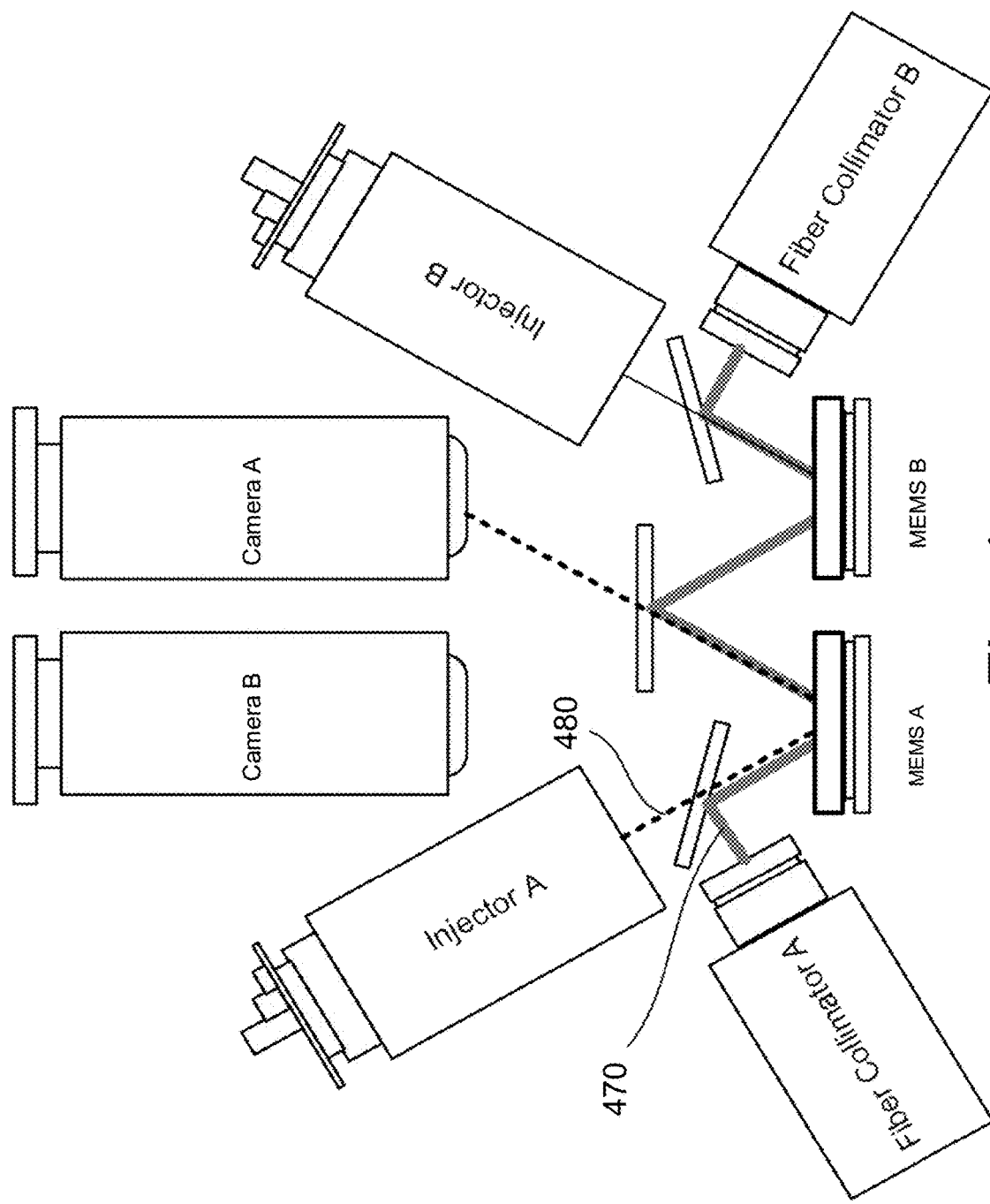
FIG. 4 is a diagram of an optical circuit switch, according to aspects of the disclosure.

FIG. 4 provides an example of a data optical path and a monitor optical path included in the optical core, also referred to as an optical link. In some examples, the optical link can refer to the entire path light takes, including external fiber, transceivers, and circulators. On data path 470, traffic comes in as light input to fiber collimator A. All of the optics in the data path 470 may be designed for very low loss over a variety of wavelengths. The light travels along this path 470, and is reflected from MEMSA, then from MEMSB, then is coupled to output fiber collimator B. MEMS A and MEMS B may be just two MEMS mirrors of a larger array, such as illustrated in FIG. 3 and explained above. By rotating the mirrors in the array, light from any input fiber may be coupled to any output fiber. The injectors shine small laser beams on the MEMS. The cameras image the beams reflected from the MEMS to measure the mirror positions.

Monitor path 480 does not carry data, but provides information to a mirror control system about the positions of the mirrors. This may be done using, for example, an injector to shine small beams on each of the MEMS mirrors, and a camera to view the positions of the beams reflected from the MEMS. There may be a camera/injector pair for each MEMS.

Figure 5:
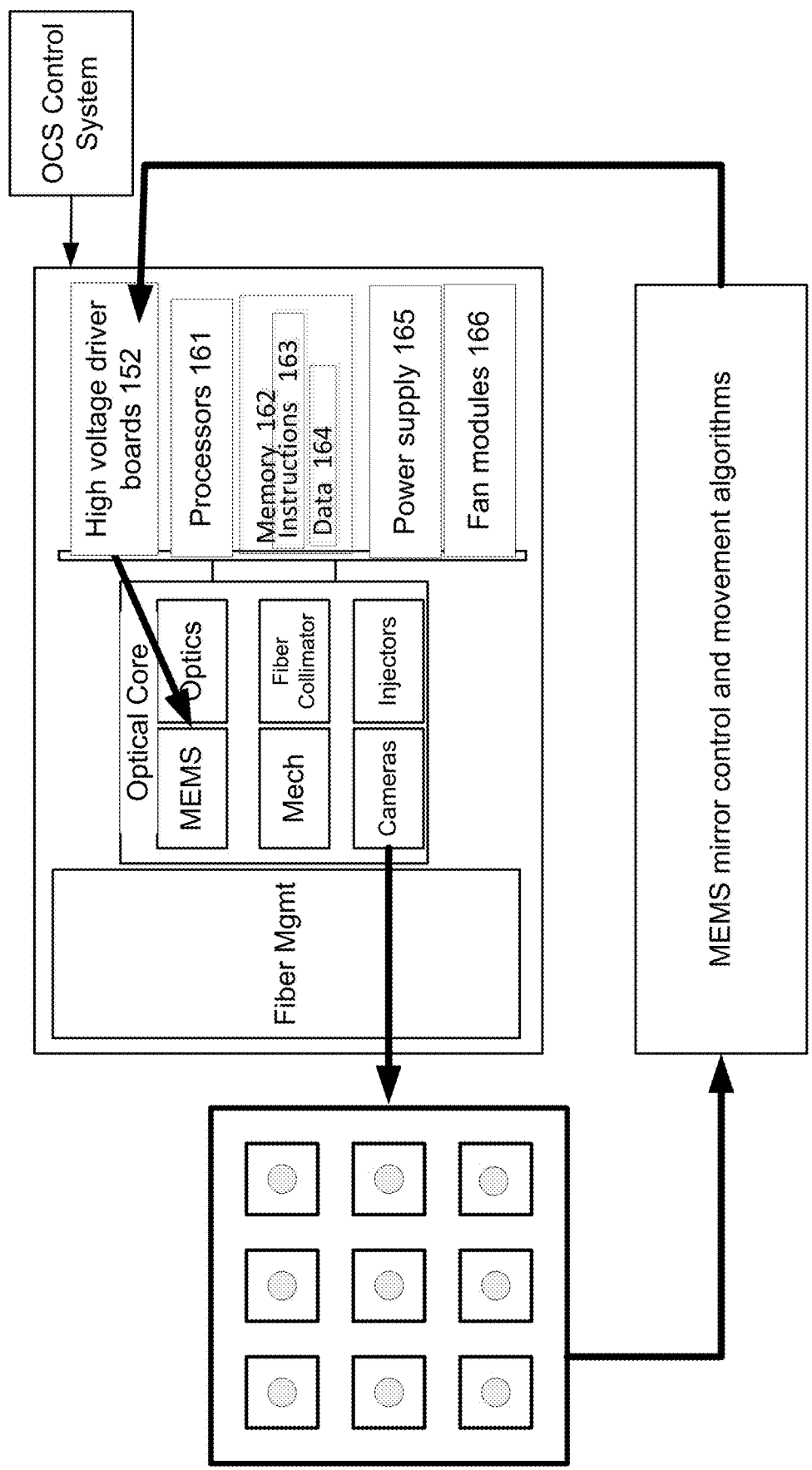
FIG. 5 is a diagram of a feedback in a mirror control loop according to aspects of the disclosure.

FIG. 5 illustrates an example mirror control loop. The OCS control system 160 tells the OCS what configuration it should be in. The mirror control loop handles the MEMS mirror control and movement algorithms based on the monitor path data, and then tells the high voltage drivers to move the mirrors.

As explained with reference to FIGS. 6A-6D, electronics 150, high voltage driver boards 152, mechanisms 133, high voltage drivers, power supply rails, and MEMS 131, or connections between those components, can be monitored for potential faults, shorts, open circuits, defects or other failures. A person of skill in the art will appreciate that although the following examples are exemplary and that other locations to place circuits or combinations of circuits can be used. Further, a person of skill in the art will appreciate that the voltages, resistances, and values used below are exemplary, and that adjusting electrical components can cause other voltages, gains, resistances, and expected readings from diagnostic circuits to be obtained. In addition, multiple circuits or descriptions from FIGS. 6A-6D can be combined to monitor multiple types of potential faults or failures within the OCS system.

In addition, the following description with reference to FIGS. 6A-6D can be modified to detect for other electrical signatures or properties to detect faults with different types of MEMS drivers or circuits/electrical components related to drivers or actuators, such as for examples, resistance, capacitance, voltage, impedance, AC current frequency or phase, DC current, or variability in the circuit. Although the description provided is with reference to MEMS drivers or MEMS actuators, any driver, actuator, or controller controlling the OCS system or mirrors within the OCS system can be monitored. The monitored electrical information which is monitored can be one of capacitance, impedance, resistance, voltage, current, phase or frequency. For example, a diagnostic circuit can be used to monitor a damaged field-effect transistor or power supply rail upstream to the first ADC. As one example, a voltage drive required from a voltage drive used to drive an electrostatic MEMS mirror actuator and provide a constant MEMS mirror deflection angle, which can be monitored by OCS cameras, may drift over time. The readback path ADC can be used to detect any changes in the drive voltage to maintain the mirror angle at a constant value.

Figure 6A:
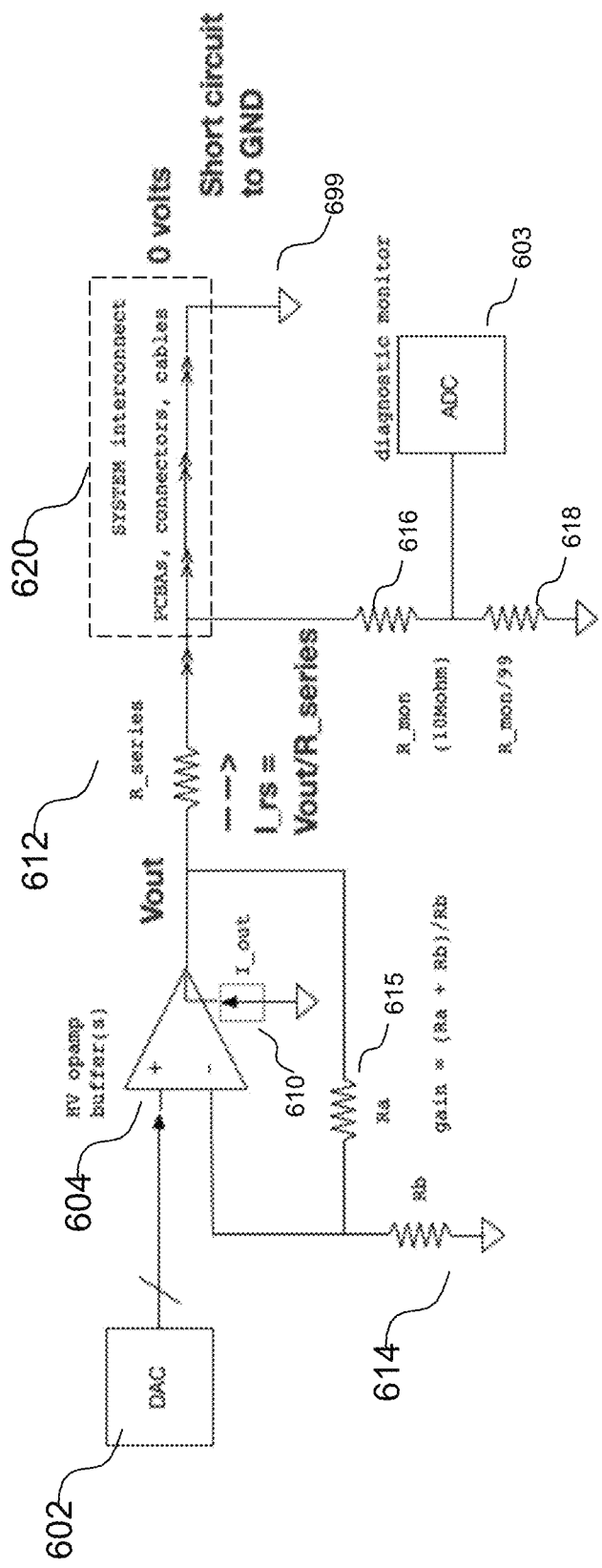
FIGS. 6A-6D illustrate example diagnostic circuits configured to diagnose or monitor a MEMS actuator drive circuits according to aspects of the disclosure.

FIG. 6A illustrates an example circuit 600 which can be integrated into an OCS. In some examples, circuit 600 can be between electronics 150 and high voltage driver boards 152 or mems 130. In other examples, the circuit can be included between an OCS control system and high voltage driver boards 152. In some examples, as many circuits as mirrors can be used. In some examples, as many circuits can be used as the number of drivers so that each circuit is in one to one correspondence to each driver, actuator, or controller. As further explained below, circuit 600 can be used to detect a short circuit. A short circuit ("short") is an electrical circuit that allows a current to travel along an unintended path with no or very low electrical impedance. This results in an excessive current flowing through the circuit and indicates that the circuit may not be operating as intended or a fault with electronics in the circuit. In some examples, in addition to or in lieu of an excessive current, the current flowing may not raise the voltage seen at the load (aka MEMS actuator) above zero volts (or a very small voltage) but may be detectable through using the disclosed technology.

Circuit 600 consists of DAC 602, analog to digital converter (ADC) 603, operational amplifier (OPAMP) 604, current source 610, resistors 612, 614, 615, 616, 618, system interconnect 620, and a MEMS actuator 699. As illustrated in FIG. 6A, circuit 600 can be used to detect a shorted actuator or interconnection between an actuator and OCS Control System.

DAC 602 can be any system which can convert a digital signal into an analog signal. For example, DAC 602 can convert a drive signal or control signal from OCS Control System to an analog signal. Several architectures can exist for a DAC. A DAC can be chosen based on requirements of resolution, maximum sampling frequency, or noise characteristics. A digital to analog conversion can also degrade a signal and a DAC can be chosen in terms of error introduced into the MEMS mirror precision or MEMS signal. In other examples, DAC 602 can be chosen based on the cumulative effect of all circuits 600 integrated into an OCS system, including thermal, noise, size, electrical, or other requirements.

ADC 603 can convert an analog signal into a digital signal, which can be provided to an OCS Control system or processors 161 for analysis. ADC 603 can act as a diagnostic monitor by detecting a voltage or current at ADC 603. Current source 610 can provide a current source or energy source which can be used to drive a MEMS driver. Current source 610 can also include a signal ground. Although illustrated in FIG. 6 as a current source connected to a ground, and the behavior of the circuit can be modeled as such, current source 610 can also be any circuit or components which can contain or be functionally equivalent to an internal OPAMP circuit.

OPAMP 604 can be an amplifier which amplifies a small input voltage to a higher output voltage. OPAMP 604 can be an amplifier which amplifies a small input voltage to a higher output voltage. The gain or amplification of OPAMP 604 can be based on resistors 614 and 615. For example, as configured in FIG. 6A, the gain can be expressed as the sum of the resistances divided by the resistance of 614, such as, gain=(RA+RB)/RB. The voltage emerging from OPAMP can be represented with VOut.

Resistors 612, 614, 615, 616, and 618 can be passive electrical components which can implement or create electrical resistance and be used as a circuit element. Resistors 612, 614, 615, 616, 618 can be used to reduce current flow, adjust signals, divide voltages, change the functionality of active elements, or have other uses based on their configuration, combination, and resistance level within a circuit. In some examples, resistors 612, 614, 615, 616, 618 can be variable resistors while in other examples, the resistors can have a relatively fixed resistance across a range of temperatures. In some examples, resistors 612, 614, 615, 616, and 618 can be chosen based on the expected operation temperature of an OCS system. Resistance of resistors 612, 614, 615, 616, and 618 can be measured in Ohms.

System interconnect 620 can include printed circuit boards (PCBs), connectors, cables, and other electronic components to connect an electric signal from DAC 602 to a MEMS driver.

As illustrated in FIG. 6A, DAC 602 can receive a signal from the OCS control system. The received electrical signal can be amplified by OPAMP 604 and sent downstream towards system interconnect 620, and in turn, to an MEMS actuator or MEMS driver. If no "short" exists, such as during expected or normal operation of the MEMS driver, the expected measurement at the ADC can be represented by VOut/100. However, if there is a short, the majority of the current will flow without resistance towards the upper part of the circuit rather than through resistors 616, and the measured reading at ADC 603 would be close to zero or some relatively small value.

Figure 6B:
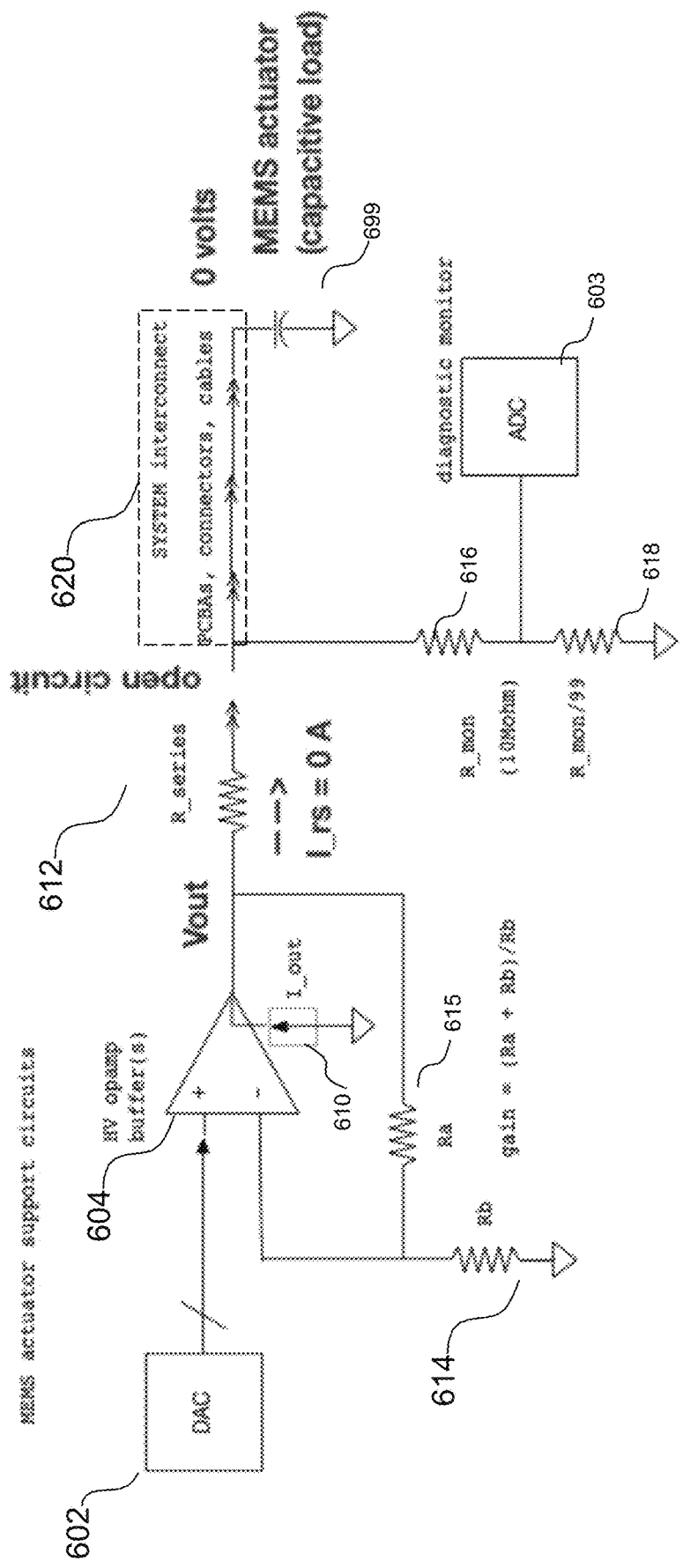

FIG. 6B illustrates an example circuit 650. Circuit 650 consists of DAC 602, analog to digital converter (ADC) 603, operational amplifier (OPAMP) 604, current source 610, resistors 612, 614, 615, 616, 618, system interconnect 620, and a MEMS actuator 699. Circuit 650 can be similar to circuit 600. As illustrated in FIG. 6B, circuit 600 can be used to detect an open circuit between OPAMP 604 and system interconnect 620.

The expected reading at ADC 603 during the normal operation of a MEMS actuator is expected to be VOut/100. However, during the presence of an open circuit, the measured diagnostic reading would be close to zero or some relatively small value.

Figure 6C:
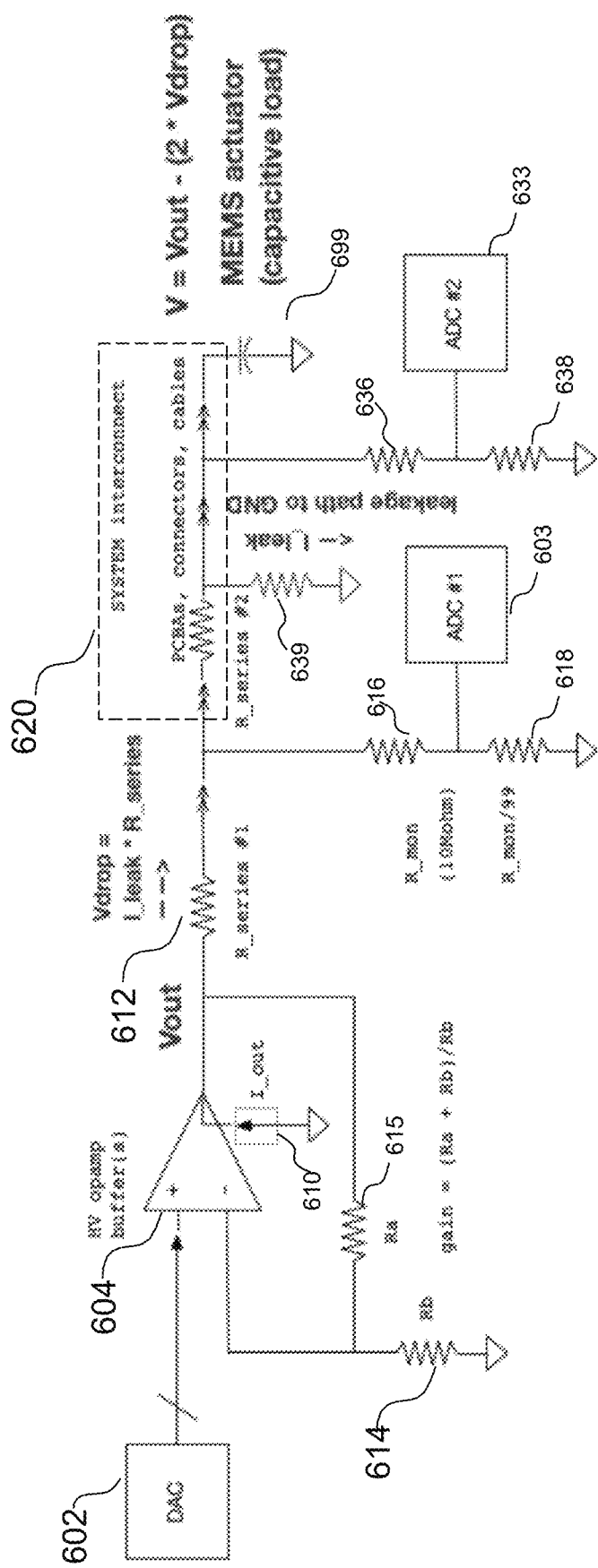

FIG. 6C illustrates an example circuit 660. Similar to circuit 600 or 650, circuit 660 consists of DAC 602, ADC 603, operational amplifier (OPAMP) 604, current source 610, resistors 612, 614, 615, 616, 618, system interconnect 620, and a and a MEMS actuator 699. In addition, Circuit 660 can also contain resistors 636 and 638, as well as an ADC 633 placed downstream from ADC 603. ADC 633 can be similar to ADC 603. Resistors 636 and 638 can be similar to other resistors described herein. Also illustrated in FIG. 6C is fault 639, which can cause a current or voltage leak. In example circuit 660, system interconnect 620 can include an additional resistance component, such as R_series #2 in FIG. 6C.

In addition to VOut, a drop in the resistance across resistor 612 due to fault 639 can be represented as VDrop and be calculated to be equivalent to current into the fault/leak*resistance of resistor 612.

Under normal conditions or operation of the OCS, drivers, and related equipment, the expected reading at both ADC 603 and ADC 633 is VOut/100. However, as illustrated in FIG. 6C, during the existence of a fault, such as fault location 639, the readings at ADC 603 and ADC 633 would both change. For example, in the presence of fault 639 drawing current into the fault, the measurement at ADC 603 would be (Vout−Vdrop)/100 while the measurement at ADC 633 would be (Vout−2*Vdrop)/100 when R_series #1 is equal to R_series #2. More generally, when R_seriers #1 is not equal to R_series #2, the measurement at ADC 633 would be (Vout−Vdrop_Rseries1−Vdrop_Rseries2). ADC 603 and ADC 633 can both be connected to a processors 161 or other component.

Although circuit 660 illustrates a single ADC placed before system interconnect 620 and ADC 633 within the system interconnect, multiple ADCs can be included in circuit 660, such as for example, by being branched before each electrical component. For example, an ADC (and associated resistors) can be placed between each electrical component, such as before system interconnect 620, between a PCB s and a connector, between a connector and a cable, and between a cable and a MEMs actuator. By placing an ADC or other diagnostic monitor at various locations in the circuit, the location of an open circuit can be particularized. For example, all ADCs downstream from the open circuit would read as 0. In some examples, another current, such as a test current, or test voltage, can be introduced through the ADC or another component to further test other downstream components from the location of the "first" fault to further test if other system components are damaged or contain an open circuit.

Figure 6D:
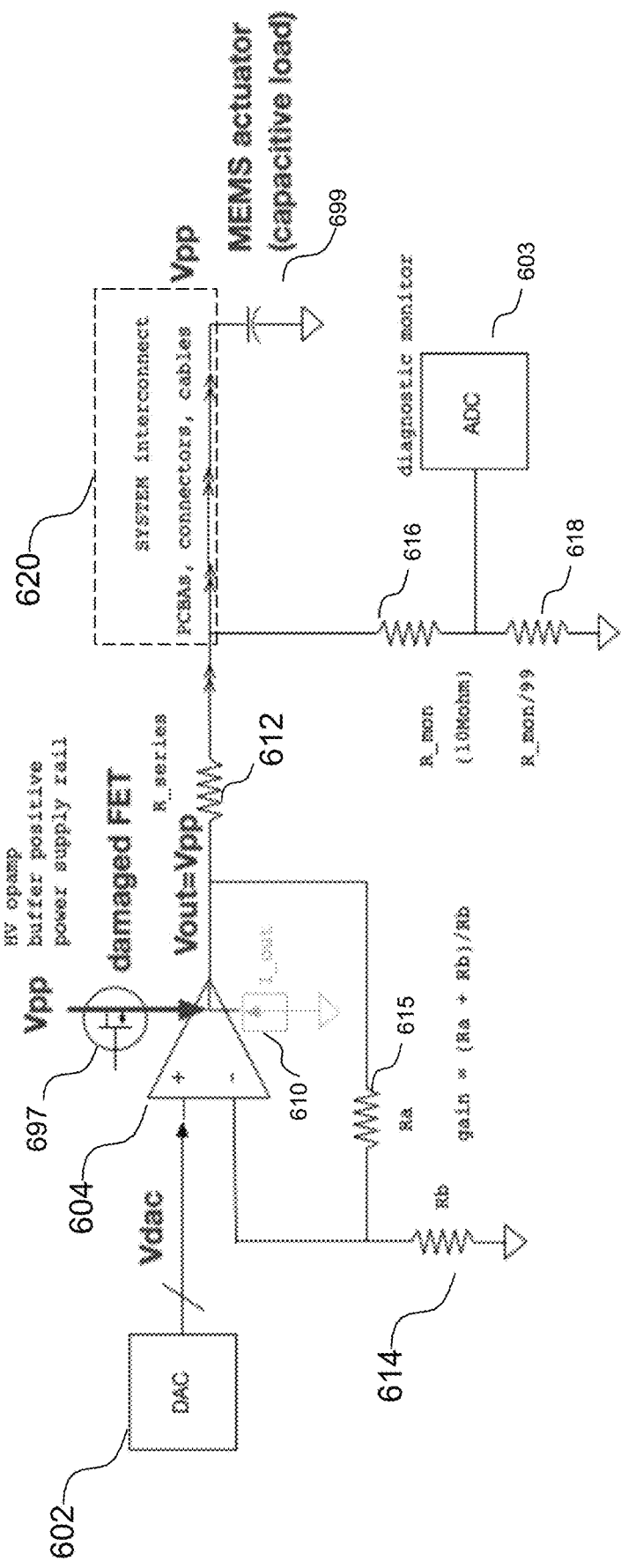

FIG. 6D illustrates an example circuit 670. Similar to circuit 600 or 650, circuit 660 consists of DAC 602, ADC 603, operational amplifier (OPAMP) 604, current source 610, resistors 612, 614, 615, 616, 618, system interconnect 620, and a MEMS actuator 699. In addition, drive circuit component 697 is illustrated in FIG. 6D. In some examples, drive circuit component 697 can be a drive field-effect transistor or a power supply rail which provides power to a MEMS actuator. Although current source 610 is included, the contribution of the internal OPAMP circuit can normally be modeled as an output current source. A shorted FET between Vout and Vpp power supplies will provide a strong pullup current that can dwarf the contribution of current source 610 as the effect of the current source is overridden by a shorted FET. Drive circuit component can have an output voltage represented by VPP.

Under normal conditions or operation of the OCS, drivers, and related equipment, the expected reading at both ADC 603 is VDAC*gain/100. However, as illustrated in FIG. 6D, if drive circuit component 697 is damaged, the reading at ADC 603 would be close to or near VPP/100.

FIG. 7 illustrates an example method 700. Method 700 can be used to monitor an OCS circuit and MEMS drivers, and determine a type of fault which exists in an OCS system.

At block 710, a diagnostic voltage or current read back path can be determined for a MEMS actuator. For example, for a particular actuator, a particular diagnostic circuit, such as circuits 600, 650, 660, or 670 can be determined and a particular circuit or pathway can be determined. In some examples, one or more pathways can be determined from which information can be obtained, such as, for example, a first ADC and a second ADC associated or within a specific diagnostic circuit. In some examples, a diagnostic circuit can combine elements of circuits 600, 650, 660, or 670.

At block 720, a test or diagnostic current or voltage can be provided or obtained from a diagnostic readback path. In some examples, the diagnostic current or voltage can be provided by a voltage driver located within a read back path. In other examples, a test voltage or current can be applied to the circuit through a path which is not critical to actuating or driving a MEMS actuator. In some examples, the diagnostic current or voltage can be based on a user-defined diagnostic program. In other examples, multiple diagnostic currents, voltages, or inputs can be provided to multiple circuits to simultaneously allow for analysis of multiple actuators or related circuitry.

At block 730, the diagnostic data can be sent to a processor. In some examples, one or more ADCs within a diagnostic circuit can be connected to a processor, such as processor 161. In other examples, the diagnostic data can be stored within memory 163 for later analysis.

At block 740, the diagnostic data or signal can be analyzed. In some examples, the obtained data can be analyzed against a database of expected values. If the obtained data deviates from the expected values, it can be determined that a fault or defect exists. In some examples, data from multiple ADCs can be analyzed collectively to determine if a fault exists within a particular area or section of the OCS.

At block 750, a notification can be provided to a user based on the analyzed data. In some examples, the type of fault determined or expected can be provided to the user. In some examples, summary information can be provided to a user related to the entirety of the OCS system, such as the number of shorts, number and location of faulty actuators, category of failed actuators, or meta-data related to the faulty actuators, such as type, drive voltage, drive current, usage history, manufacturer, or operating temperature can also be displayed or analyzed in conjunction with the actuator.

At block 760, a pre-emptive action can be taken based on the analyzed data or notification provided. In some examples, the use of a MEMS actuator related to the fault can be stopped or prevented and another MEMS actuator or MEMS mirror can be used.

In some examples, data obtained in method 700 or as described in FIGS. 6A-6D can be analyzed to determine the age, age-related effects, such as related drift, and expected error rate of the OCS system or MEMS mirror array. For example, one or more gain setting resistors from circuits 600, 650, 660, 670 could drift over time or temperature, causing an output voltage Vout to drift from expected values. Likewise, a given mirror actuator drive voltage can be monitored for drift over time and/or temperature as it is held at a constant deflection angle, which can be monitored by the internal cameras.

In some examples, a diagnostic voltage or current readback path for each MEMS actuator voltage control channel can provide a method to detect and diagnose faults in the actuator control signal path. Multiple measurement points can be used to provide additional capabilities of isolating faults among multiple subassemblies or components in the control signal path. The diagnostic voltage or current readback path can use analog-to-digital convertors ADC(s) and multiplexers to view multiple control channels and/or multiple measurement points in each control channel. Digitized voltages, or currents, in the case of magnetic actuators, can be read from the diagnostic ADC and can be compared to expected values to detect and isolate faults.

In some examples, a single ADC can monitor multiple voltage sensing points within a signal path by using an analog multiplexer to switch which signal path is being observed. In other examples, a single ADC can be used and a particular signal path and the source of a defect can be analyzed through the use of a digital switch to control which signal path is being monitored. In this manner, the analysis of several pathways and multiple points within a drive circuit can be monitored and analyzed for faults. In some examples, a single ADC can monitor multiple actuators related to a single MEMs mirror using an analog multiplexer or similar device or mechanism. In other examples, a single ADC can monitor actuators or drive pathways related to multiple actuators using an analog multiplexer or similar device or mechanism. The use of a single ADC for monitoring multiple pathways can reduce the additional circuitry required and save space in an OCS where space may be limited. In some examples, a digital controller, such as a CPU, BMC, embedded controller, or FPGA, can be configured to control or take control of a set of selection inputs of an analog mux, such that the digital controller is controlling which input(s) are being sensed by the analog to digital convertor.

A person of skill in the art will understand that the various disclosed components can be coupled electronically by one or more of the disclosed electronics, processors, and computing devices to perform the methods and techniques disclosed herein. For simplicity and clarity, not every electronic or data link is illustrated or disclosed and a person of skill in the art will appreciate that various sensors, photodetectors, lasers, and other electronics can be controlled collectively and be in data connectivity with one another or one or more computing devices.

While this disclosure contains many specific implementation details, these should not be construed as limitations on the scope of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

The invention claimed is:
1. A system comprising:
an optical circuit switch (OCS), the OCS comprising:
an OCS control system; and
a mirror array, wherein:

individual mirrors within the mirror array are coupled with at least one actuator controlled by the OCS control system, and wherein the mirror array is a driver actuated mirror array or an actuator actuated mirror array; and at least one diagnostic circuit coupled to the at least one actuator via a drive circuit, the at least one diagnostic circuit being separate from the OCS control system, the at least one diagnostic circuit comprising:

a first analog to digital converter (ADC), wherein the first analog to digital convertor is coupled to a processor or the OCS control system and configured to output electrical information related to the drive circuit, and a drive circuit component configured to provide power to the mirror array, the drive circuit component being a drive field-effect transistor or a power supply rail.

2. The system of claim 1 further comprising a second ADC, the second ADC electrically downstream from the first ADC.

3. The system of claim 2 wherein the second ADC is configured to detect a fault within a printed circuit board, connector, or cable, connecting a power supply to the actuator.

4. The system of claim 2 wherein the first ADC and second ADC are collectively configured to monitor a current leak within an interconnect between a power supply and the actuator.

5. The system of claim 1 wherein the electrical information is one of capacitance, impedance, resistance, voltage, current, phase or frequency.

6. The system of claim 1 wherein:

the at least one diagnostic circuit is configured to detect a short within the actuator, or the at least one diagnostic circuit is configured to detect an open circuit.

7. The system of claim 6 wherein the open circuit exists upstream to the first ADC.

8. The system of claim 1 wherein the at least one diagnostic circuit is configured to detect a damaged field-effect transistor or power supply rail upstream to the first ADC.

9. The system of claim 1 wherein a digital to analog converter (DAC) is connected to the OCS control system and provides a drive current or drive voltage for the actuator.

10. The system of claim 9 wherein the DAC is configured to provide a test voltage or test current for the at least one diagnostic circuit.

11. A method of detecting a fault within an actuator drive circuit integrated within an optical circuit switch (OCS), the method comprising:

determining, using a processor, a diagnostic read path within the actuator drive circuit, the diagnostic read path comprising at least one diagnostic circuit separate from a controller of the OCS, the at least one diagnostic circuit comprising a drive circuit component configured to provide power to a mirror array of the OCS, the drive circuit component being a drive field-effect transistor or a power supply rail, wherein the mirror array is a driver actuated mirror array or an actuator actuated mirror array;

providing or obtaining, responsive to a command by an OCS control module, a diagnostic current or voltage from the diagnostic read path; and obtaining diagnostic data from an analog to digital converter (ADC).

12. The method of claim 11 comprising analyzing a plurality of data obtained from a plurality of ADCs, each of the plurality of ADCs corresponding to a unique actuator.

13. The method of claim 11 comprising comparing the diagnostic data to a historic value.

14. The method of claim 13 comprising determining a fault exists when the diagnostic data does not match the historic value.

15. The method of claim 11 comprising matching the diagnostic data to data associated with a known fault type.

16. The method of claim 15 wherein the known fault type is one of an open circuit, a short circuit, or voltage leak.

17. The method of claim 15 comprising providing a notification to a user upon classifying the type of fault.

18. The method of claim 11 comprising deactivating or preventing use of an actuator upon determining a fault exists within the actuator drive circuit or an actuator control channel.

19. The method of claim 18 wherein the actuator is one of a piezo actuator, magnetic actuator or microelectromechanical systems (MEMS) actuator.

20. The method of claim 11, further comprising analyzing, by the processor, the diagnostic data to determine a fault within the actuator drive circuit.

* * * * *